United States Patent
Van Vaals

(10) Patent No.: US 6,426,994 B1
(45) Date of Patent: Jul. 30, 2002

(54) IMAGE PROCESSING METHOD

(75) Inventor: Johannes J. Van Vaals, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/551,005

(22) Filed: Apr. 18, 2000

(30) Foreign Application Priority Data

Apr. 20, 1999 (EP) .............................................. 99201249

(51) Int. Cl.$^7$ .......................... G01R 33/563; G06T 5/50
(52) U.S. Cl. .................... 378/98.12; 382/130; 382/132; 382/282
(58) Field of Search .............................. 378/98.12, 98.9, 378/98.11; 382/130, 131, 132, 282, 283, 101, 102

(56) References Cited

U.S. PATENT DOCUMENTS

| | | | |
|---|---|---|---|
| 4,204,226 A | | 5/1980 | Mistretta et al. ............ 358/111 |
| 4,456,926 A | * | 6/1984 | Kruger et al. ............ 378/98.12 |
| 4,516,265 A | * | 5/1985 | Kizu et al. .................. 382/102 |
| 4,633,307 A | * | 12/1986 | Honda ........................ 378/98.5 |
| 5,123,056 A | * | 6/1992 | Wilson ....................... 378/98.6 |
| 5,839,440 A | * | 11/1998 | Liou et al. .................. 600/431 |
| 6,196,715 B1 | * | 3/2001 | Nambu et al. .............. 378/197 |

OTHER PUBLICATIONS

Merriam–Webster's Collegiate Dictionary, 10$^{th}$ Ed., 2001, Pub. Merriam–Webster, Inc., p. 89.*
Time–resolved contrast enhanced 3D MR Angiography by F.R. Korosec et al in MRM 36 (1996), pp. 345–351.
"A Method of Distinguishing Arteries and Veins in Intra–Vascular Contrast Agent Enhanced MR Angiography" by O. Simonetti, A, Krishnan, B. Geiger and J. Bundy, in Proceedings of the International Society for Magnetic Resonance of Medicine, Sixth Scientific Meeting and Exhibition, Sydney, Australia, Apr. 18–24, 1998, vol. 2, p. 777.

* cited by examiner

Primary Examiner—Robert H. Kim
Assistant Examiner—Chih-Cheng Glen Kao
(74) Attorney, Agent, or Firm—John Vodopia

(57) ABSTRACT

An image processing method includes the acquisition of a succession of low-resolution images. A succession of mask images is derived from the low-resolution images. Furthermore, a high-resolution image is acquired. The mask images are applied to the high-resolution image as bandpass filters in order to form a filtered high-resolution image. The filtered high-resolution image represents image information relating to a particular phase of a dynamic process, such as the passage of blood through the vascular system of a patient. The image processing method is used, for example in MR angiography or in X-ray angiography. An MRI system or an X-ray examination apparatus is provided with an image processor for carrying out the image processing method according to the invention.

13 Claims, 5 Drawing Sheets

IMAGE PROCESSING METHOD

BACKGROUND OF THE INVENTION

1. Field of the Invention

The invention relates to an image processing method. The invention concerns notably an image processing method for producing one or more processed images in which changes in an object to be imaged are clearly reproduced. An image processing method of this kind is used particularly in angiography. During angiography images are formed of the blood vessels of a patient to be examined. To this end, a contrast agent is applied to the vascular system of the patient to be examined. First the arteries in the part of the body of the patient to be examined are filled with the contrast agent which later also reaches the veins. The type of contrast agent may differ, in dependence on the technique used to image the blood vessels; however, the contrast agent ensures in any case that the blood vessels are suitably detected by means of the relevant technique. The blood vessels of the patient to be examined can be imaged by means of magnetic resonance techniques utilizing a contrast agent in the form of a substance which produces a magnetic resonance signal which is stronger than that produced by the surrounding tissue. Such a technique for magnetic resonance imaging of the blood vessels of the patient to be examined is also referred to as magnetic resonance (MR) angiography. The blood vessels of the patient to be examined can also be imaged in X-ray images, the contrast agent then having an X-ray absorption which is higher than that of the surrounding tissue.

2. Description of Related Art

The article *Time-resolved contrast enhanced 3D MR Angiography* by F. R. Korosec et al in MRM 36 (1996), pp. 345–351, describes a specific MR angiography method.

According to the known MR angiography method, successive magnetic resonance images are formed of a part of the vascular system of the patient to be examined. The magnetic resonance (MR) signals originating from the contents of the blood vessels are acquired during the passage of the blood with the contrast agent through the blood vessels. MR signals are acquired notably while the arteries in the relevant part of the vascular system have already been filled with the contrast agent but the contrast agent has not yet reached the veins. An arterial magnetic resonance image which shows the arteries filled with the contrast agent is derived from such MR signals. After some time, when the contrast agent has also reached-the veins and has not yet disappeared from the arteries, MR signals are acquired again. A venous magnetic resonance image which shows only the veins filled with the contrast agent is derived from the latter MR signals. Subsequently, a subtraction image is formed by subtracting the venous magnetic resonance image from the arterial magnetic resonance image. The subtraction image does offer useful information as regards the passage of blood with the contrast agent through the vascular system of the patient. However, the known MR angiography method cannot be used very well when a more recent, so-called "blood-pool" contrast agent is used. Such a contemporary contrast agent remains in the vascular system for a comparatively long period of time, for example from 10 seconds to as long as one minute, so that it takes a long time for the contrast agent to disappear from the arteries. More specifically, such a contemporary contrast agent remains in the vascular system so long that, when the contrast medium reaches the veins, a considerable concentration of contrast agent is still present in the artery whereto the contrast agent has been administered. When the known MR angiography method is used in conjunction with a contemporary contrast agent, therefore, it is necessary to postpone the acquisition of the MR signals for the venous magnetic resonance image for a long period of time after the administration of the contrast agent.

Citation of a reference herein, or throughout this specification, is not to construed as an admission that such reference is prior art to the Applicant's invention of the invention subsequently claimed.

SUMMARY OF THE INVENTION

It is an object of the invention to provide a method for imaging a dynamic process, such as the passage of blood with the contrast agent through the vascular system of the patient to be examined, more accurately and faster than the known MR angiography method. It is notably an object of the invention to provide an MR angiography method in which the passage of blood through the vascular system requires less time than in the known MR angiography method.

This object is achieved by means of an image processing method according to the invention wherein a succession of two or more low-resolution images is acquired, a series of one or more successive mask images is derived from the low resolution images, a high-resolution image is acquired, at least one of the mask images is applied to the high-resolution image as a bandpass filter in order to derive a filtered high-resolution image from the high-resolution image.

The one or more low-resolution images contain image information with a comparatively low spatial resolution. This means that the smallest detail that is faithfully reproduced in the low-resolution images is comparatively large. For example, the low-resolution images contain 64×64 or 128×128 pixels for a field of view having a diameter of from 20 to 40 cm. For the same field of view the high-resolution image contains 512×512 or even 1024×1024 pixels. The low-resolution images are successively acquired, so that the image information in the successive low-resolution images differs as a function of the changes occurring in the imaged object during the dynamic process, for example the progress of the contrast agent in the blood vessels of the patient to be examined.

The one or more mask images relate to variations of the spatial low-resolution image information of one or more successive phases of a dynamic process being studied by means of the image processing method according to the invention. For example, the successive mask images represent respective differences between successive low-resolution images. It is alternatively possible to derive the individual mask images from the low-resolution images in such a manner that such a mask image represents a cumulation of successive differences. For successive mask images the cumulation has then always been continued up to and including another phase of the dynamic process. Such a dynamic process is notably the passage of blood with the contrast agent through the vascular system of the patient to be examined. The phases of the dynamic process concern parts of the dynamic process which take place within finite time intervals. Such a time interval may be short or long, depending on the rate at which changes occur during the dynamic process. For example, in the case of the passage of blood through the vascular system of the patient the individual phases have a duration of approximately 10 seconds.

The filling of the arteries with the contrast agent notably takes approximately from 10 to 40 seconds. The high-resolution image relates to the same (part of the) object as the low-resolution images, but the high-resolution image contains inter alia more image information with a much higher spatial resolution. This means that the high-resolution image faithfully reproduces details which are much smaller than the smallest details faithfully reproduced in the low-resolution images. For example, the spatial resolution of the low-resolution images is from five to ten times less than the spatial resolution of the high-resolution images. The one or more mask images are applied to the high-resolution image as a bandpass filter in order to select image information from the high-resolution image on the basis of the brightness values in the relevant mask image. For example, such a mask image is used as a bandpass filter by selecting from the high-resolution image those parts for which the relevant mask image has brightness values in a predetermined range in positions corresponding to positions in those parts of the high-resolution image. For example, it is thus possible to select from the high-resolution image the high-resolution image information which corresponds to a part reproduced with a low resolution in the relevant mask image. The filtered high-resolution image represents image information relating to the relevant phase of the dynamic process, such as the passage of blood with the contrast agent through the vascular system. The high-resolution image is acquired preferably while the contrast agent is present in practically the entire part to be examined of the vascular system of the patient. The filtered high-resolution image contains image information relating to brightness variations over small distances, so that the high-resolution image contains image information relating to small details in the relevant phase of the dynamic process. The relevant phase in the filtered high-resolution image corresponds to the phase of the dynamic process associated with the mask image used. The filtered high-resolution image relates to small details of the relevant phase of the dynamic process. The low-resolution images can be acquired in a fast manner in the course of the dynamic process. For example, low-resolution magnetic resonance images are acquired while the contrast agent flows through the vascular system (arteries and veins) together with the blood. The low-resolution magnetic resonance images are reconstructed from magnetic resonance (MR) signals relating mainly to spatial low-frequency information. This spatial low-frequency information is acquired by scanning only a central part of the reciprocal space of wave vectors (also referred to as k space) in a vicinity of the origin (k=0) during the acquisition of the MR signals. This means that MR signals having a wave vector lying in the central part of the k space are notably used to form the magnetic resonance image. Consequently, the MR signals can be acquired and the low-resolution images reconstructed in a short period of time of, for example one or a few seconds.

Preferably, a plurality of, for example five, ten or fifteen successive mask images are used so as to be applied to the high-resolution image as respective bandpass filters. This yields a number of successive filtered high-resolution images. The progress of the dynamic process can be accurately followed on the basis of such successive high-resolution images. As more low-resolution images are acquired per unit of time, more filtered high-resolution images can be formed per unit of time. The dynamic process can be followed on the basis of such filtered high-resolution images, notably the passage of blood with the contrast agent through the vascular system, the temporal resolution being higher as more low-resolution images are formed per unit of time. The successive mask images which are applied to the high-resolution image in order to obtain the filtered high-resolution image are derived from the respective low-resolution images. According to the invention only one high-resolution image is required. However, it is also possible to use a plurality of high-resolution images in order to derive the filtered high-resolution images therefrom; in any case, the number of high-resolution images required is much smaller, for example some tens of times smaller, than the number of successive low-resolution images. The dynamic process to be examined often progresses so fast that not enough time is available for the acquisition of high-resolution images during the individual phases. According to the invention, however, low-resolution images can be acquired during the individual phases the filtered high-resolution images can be derived therefrom in conjunction with a high-resolution image acquired at a later stage. It is thus achieved according to the invention that the dynamic process can be followed with a high temporal resolution and a high spatial resolution. This means that phenomena in the dynamic process which are of short duration only and take place in a small volume can nevertheless be accurately followed on the basis of the filtered high-resolution images. For example, the high-resolution images clearly illustrate in great detail how small blood vessels are filled with blood with the contrast agent.

The filtered high-resolution image is formed preferably by selecting from the high-resolution image those positions and their pixel values where the pixel value in the corresponding position in the mask image exceeds a predetermined threshold value. This implementation can be advantageously used notably when the difference images between successive low-resolution images are used as the mask images. The pixel values of such difference images constitute the differences between the pixel values of corresponding positions in the successive low-resolution images. Such difference images can be readily derived digitally from the low-resolution images. Moreover, the mask images in the form of the difference images can be readily used digitally as the bandpass filters applied to the high-resolution image.

When the difference between pixel values in the successive resolution images is less than a predetermined ceiling value, usually non-monotonic progress of the dynamic process is concerned. This occurs notably when in MR angiograpy the concentration of the contrast agent in a blood vessel first increases and later decreases again. In positions in the mask images in which the difference between the pixel values in corresponding positions of the low-resolution images is below the ceiling value, pixel values of a predetermined magnitude below the threshold value are added. For example, the ceiling value and the threshold value are equal and preferably have the value zero. The value zero represents, for example a brightness value which is less than all brightness values in the high-resolution image which relate to image information of the object imaged. As a result of this choice, the brightness value is taken to be equal to zero in positions in the individual filtered high-resolution image if the difference between the brightness values in the corresponding positions in the successive low-resolution images is negative. It is thus ensured that in the separate filtered high-resolution images there is selected only image information which relates to a monotonically progressing part of the dynamic process. For example, only the increase of the concentration of the contrast agent can thus be reproduced in the filtered high-resolution images. It is thus achieved that only the filling of the blood vessels is reproduced in the filtered high-resolution images and not the disappearance of the contrast agent from the blood vessels. However, it is alternatively possible to acquire the low-resolution images during the disappearance of the contrast agent from the veins, thus forming high-resolution images which accurately show the contrast agent leaving the veins.

The invention also relates to a magnetic resonance imaging system and to an X-ray examination apparatus. It is also an object of the invention to provide a magnetic resonance imaging system or an X-ray examination apparatus which is suitable for carrying out the image processing method according to the invention. To this end, the magnetic resonance imaging system and/or the X-ray examination apparatus according to the invention is provided with a signal processing unit arranged to perform the methods of this invention. Such a signal processing unit includes, for example a computer which is programmed to execute the functions of the signal processing unit. It is also possible to provide the signal processing unit with a special purpose (micro) processor which is provided with electronic (integrated circuits) which are arranged to execute the functions of the signal processing unit.

The invention further relates to a workstation arranged to receive a series of low-resolution images and a high-resolution image. For instance, such images may be supplied to the workstation in the form of digital image signals, such as digital electronic videosignals. According to the invention the workstation is arranged to derive the series of one or more successive mask images from the low-resolution images, apply at least one of the mask images to the high-resolution image as a bandpass filter in order to derive a filtered high-resolution image from the high-resolution image.

Advantageously, the workstation according to the invention comprises a computer into which a computer program is loaded, which computer program comprises instructions for employing the image processing method according to the invention.

The invention also relates to a computer program comprising instructions for employing the image processing method according to the invention.

These and other aspects of the invention are apparent from and will be elucidated, by way of example, with reference to the embodiments described hereinafter and on the basis of the accompanying drawing; therein:

DETAILED DESCRIPTION OF THE PREFERRED EMBODIMENT

Figure 1:
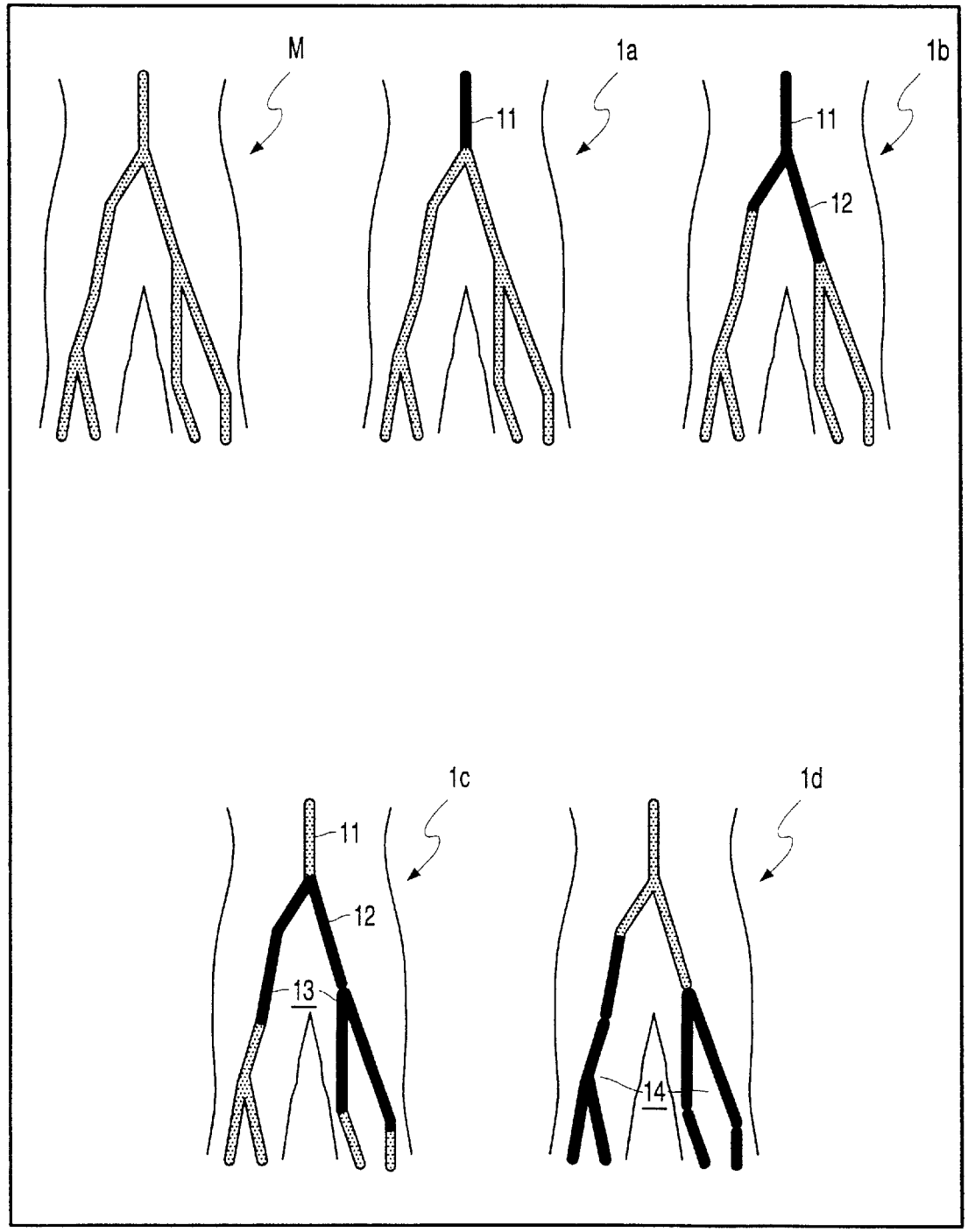
FIG. 1 shows a succession of low-resolution images reproducing the progress of contrast agent in the vascular system in the legs of a patient to be examined.

FIG. 1 shows a succession of low-resolution images, M, 1a, 1b, 1c, 1d reproducing the progress of contrast agent in the vascular system in the legs of the patient to be examined. The low-resolution image M has been acquired before the administration of contrast agent to the patient to be examined. The low-resolution image, therefore, shows only tissue of blood vessels without contrast agent. In the low-resolution image 1a only a part of the vascular system in the region 11 of the groin of the patient to be examined is filled with contrast agent. In the next low-resolution image 1b contrast agent is present in both leg arteries in the region 11 of the groin as well as in a region 12 directly beyond the bifurcation of the aorta. In the subsequent low-resolution image both leg arteries are filled with contrast agent also in a region 13 of both upper legs. In the phase shown in the low-resolution image 1c the contrast agent has already partly disappeared from the region 11 of the groin. In the last low-resolution image 1d of FIG. 1 the contrast agent has reached the lower part 14 of the upper legs and the leg arteries are filled with contrast agent substantially throughout both upper legs, whereas in the region 12 directly beyond the bifurcation of the aorta in the leg arteries the contrast agent has already partly disappeared again. The low-resolution images 1c and 1d clearly show that the flow of blood with the contrast agent is faster in the right leg than in the left leg. Such a difference indicates a possible anomaly in the vascular system in the left leg of the patient to be examined.

Figure 2:
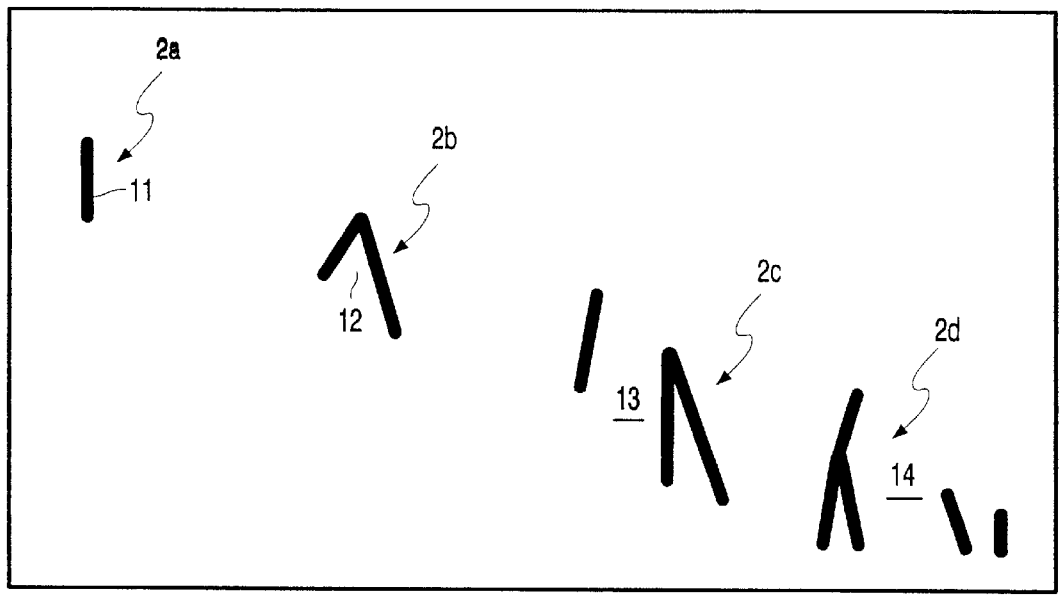
FIG. 2 and FIG. 3 show successions of mask images derived from the low-resolution images of FIG. 1.

FIG. 2 shows a succession of mask images derived from the low-resolution images of FIG. 1. The successive mask images notably concern respective differences between successive pairs of low-resolution images of FIG. 1. FIG. 2 shows notably mask images 2a, 2b and 2c and 2d. The mask image 2a concerns the difference between the low-resolution images 1a and M. The mask image 2a shows only the part 11 of the groin which is first filled with contrast agent. The mask image 2b concerns the difference between the low-resolution resolution images 1b and 1a. The mask image 2a relates to the phase of the dynamic process of flow through the blood vessels of the patient to be examined, i.e. the filling of the part 12 of the blood vessels with contrast agent. The mask image 2b concerns the difference between the low-resolution images 1c and 1d and the mask image 2c relates to the filling of the blood vessels in the region 13. The mask image 2c concerns the difference between the low-resolution images 1d and 1c. The mask image 2d relates to the filling of the lower part 14 of the upper legs with contrast agent. The pixel values of the mask images 2a, 2b and 2c amount each time to the difference between pixel values in corresponding positions in the successive low-resolution images 1a, 1b, 1c, 1d. For example, the pixel values of the low-resolution images and the mask images are digital values in the range of from 0 to 255. When a difference between pixel values of successive low-resolution images is negative, the value 0 is taken for the pixel value in the relevant mask image. Such a negative difference occurs, for example because in the region of the groin 11 the contrast medium has already partly disappeared in a later stage of the passage of the contrast medium. The pixel values in corresponding positions in the region 11 in, for example the low-resolution images 1c and 1b have a negative difference. In the relevant positions in the mask image 2a the pixel values are taken to be equal to 0. It is thus achieved that the mask image 2a just corresponds to the blood with contrast agent reaching the bifurcation of the aorta in the leg arteries in the region 12. The occurrence of negative pixel values, relating to the disappearance of the contrast agent from the region 11 of the groin, is notably counteracted in the mask image 2a.

Figure 3:
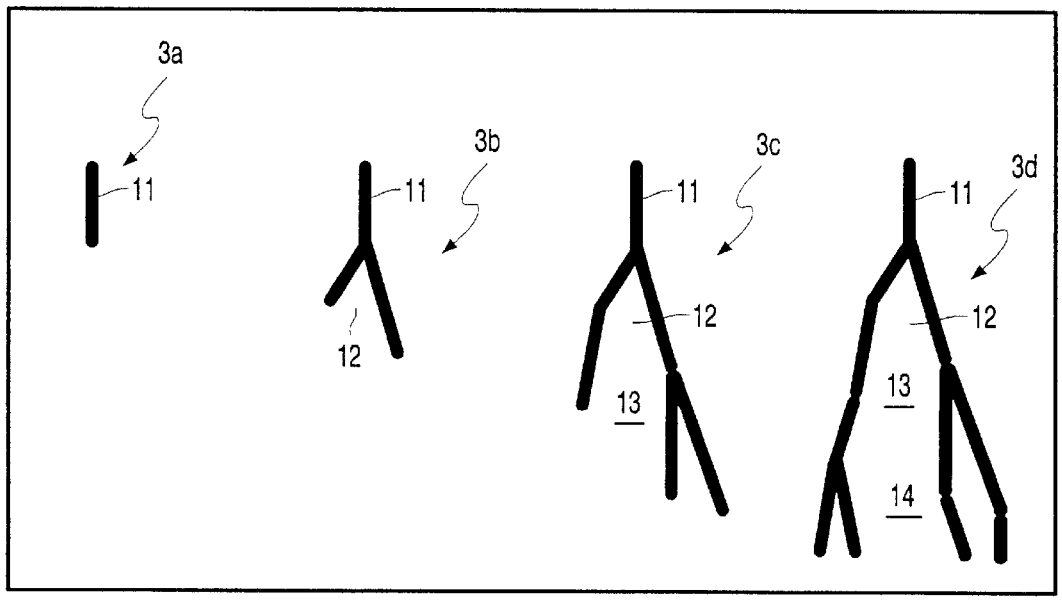

FIG. 3 shows a succession of mask images derived from the low-resolution images of FIG. 2. FIG. 3 shows mask images 3a, 3b, 3c and 3d. Each mask image 3a to d in FIG. 3 concerns the cumulation of a number of successive mask images of FIG. 2. FIG. 3 shows mask images which correspond to respective phases of the dynamic process and have been combined from the mask images of FIG. 2 of the relevant phase and the preceding phases. For example, the mask image 3c is formed by combination of the mask images 2a, 2b and 2c. The mask image 3b shows the progress of the contrast agent through the vascular system as from the stage in which the region of the groin 11 is filled with contrast agent up to and including the stage in which the contrast agent has reached the region 13 of the blood vessels of the upper legs. The mask image 3c shows the stages as from the filling of the region 11 of the groin up to and including the filling of the region 12 directly beyond the bifurcation of the aorta in the leg arteries. The mask image 3d shows all stages as from the filling of the region of the groin 11 up to and including the filling of the blood vessels in the lower part 14 of the upper legs with contrast agent. The mask image 3a relates only to the filling with contrast agent of the region 11 of the groin.

Figure 4:
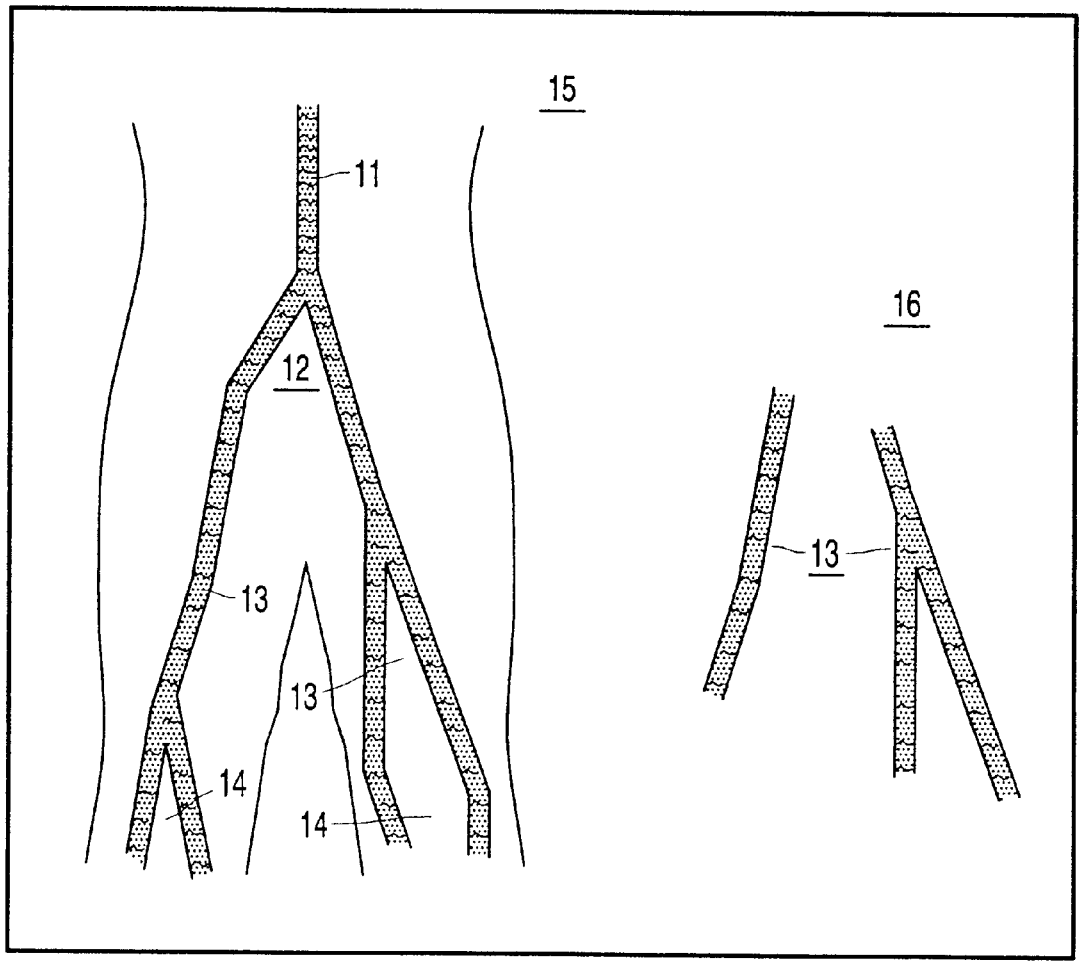
FIG. 4 shows a high-resolution image and a high-resolution image filtered by means of a mask image as shown in FIG. 3.

FIG. 4 shows a high-resolution image 15 and a filtered high-resolution image 16 which has been filtered by means of a mask image as shown in FIG. 3. The filtered high-resolution image shows the part of the blood vessels 13 of the patient to be examined with a high spatial resolution. This means that small details are suitably visibly and faithfully reproduced. In the example shown the mask image 3c of FIG. 3 has been applied as a bandpass filter to the high-resolution image 15. The high-resolution image 15 shows the blood vessels filled with the contrast agent and also the surrounding tissue. In the filtered high-resolution image the surrounding tissue and the parts of the blood vessels that relate to flow phases of the blood with the contrast agent other than the phase corresponding to the mask image 3c are suppressed.

Figure 5:
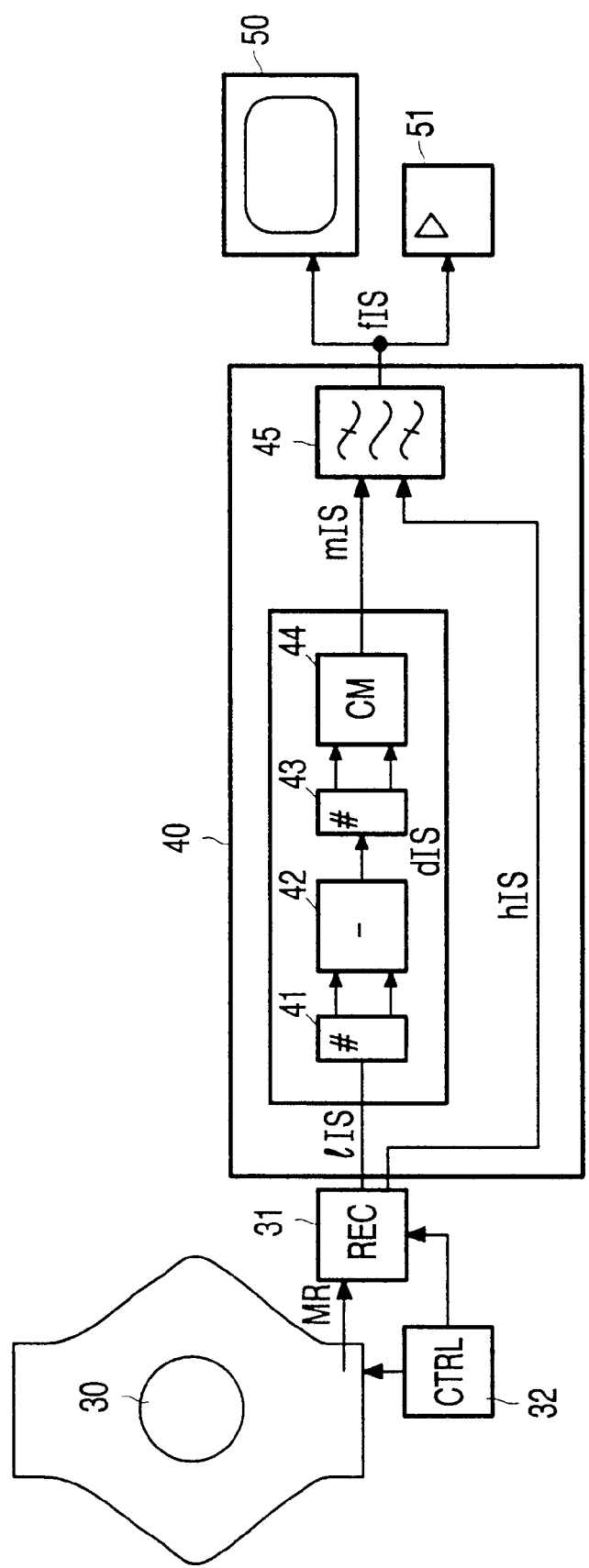
FIG. 5 shows diagrammatically a magnetic resonance imaging system in which the invention is used.

FIG. 5 shows diagrammatically a magnetic resonance imaging system in which the invention is used. The magnetic resonance imaging system includes a main magnet which generates a uniform, steady magnetic field in an examination space 30. The magnetic resonance imaging system also includes gradient coils for superposing magnetic gradients on the steady magnetic field of the main magnet. The magnetic resonance imaging system is also provided with transmission and receiving coils. The patient to be examined is arranged partly in the magnetic field in the examination space 30. The transmission coils transmit a radio frequency (RF) excitation pulse which excites spins in a selected part of the body of the patient to be examined. For example, the selected part is a slice taken in a cross-section of the body. The part of the body in which the spins are to be excited by the RF excitation pulse is selected by application of a magnetic selection gradient by the gradient coils. After the excitation the spins relax, the spins then emitting RF magnetic resonance signals (MR signals). The MR signals are spatially encoded on the basis of the position in the body of the respective relaxing spins generating the MR signals; such encoding is performed by application of phase encoding gradients and read-out gradients. The MR signals are applied to a reconstruction unit 31. The reconstruction unit 31 corrects the MR signals for known error sources in the magnetic resonance imaging system and reconstructs electronic image signals representing MR images of the patient to be examined from the MR signals. Using the selection gradient, the phase encoding gradients and the read-out gradients, slice images of the body of the patient can be derived from the MR signals, which slice images involve various orientations of the cross-sections, i.e. cross-sections in various projection directions. According to the invention the magnetic resonance imaging system applies a series of low-resolution image signals (lIS) and a high-resolution image signal (hIS) to the image processing unit 40. The magnetic resonance imaging system includes a control unit 32 whereby electric currents through the gradient coils and the transmission and receiving coils are controlled so as to acquire, for example, MR signals from a desired part of the k space. The control unit 32 also controls the adjustment of the reconstruction unit 31. The low-resolution image signal is formed by the magnetic resonance imaging system by acquiring MR signals exclusively from a central part of the k space. Only MR signals having a wave vector of small magnitude, for example only k=0, are then acquired. The low-resolution image signals (lIS) are applied to a signal buffer 41. Successive low-resolution image signals are subtracted from one another by means of a subtraction unit 42. The subtraction unit 42 calculates differences between pixel values or signal levels of successive low-resolution image signals. The results of the subtractions performed by the subtraction unit constitute difference image signals (dIS) which are stored in a difference buffer 43. The difference buffer 43 applies successive difference image signals (dIS) to a cumulation unit 44. The cumulation unit combines difference image signals (dIS) so as to form one or more mask image signals (mIS). For example, the difference image signals (dIS) represent the mask images shown in FIG. 2 and the mask image signals (mIS) represent the mask images shown in FIG. 3. In the example shown in FIG. 5 the mask image signals (mIS) are applied to the control input of a bandpass filter 45. The mask image signals (mIS) represent the respective cumulations of one or more phases of the flow through the blood vessels of the legs of the patient to be examined.

The magnetic resonance imaging system also generates a high-resolution image signal representing the high-resolution image. The high-resolution image signal (hIS) is formed notably by the acquisition of MR signals in a large part of the k space; this means that MR signals are acquired with small and large values for the components of their wave vector. After correction for disturbances in the magnetic resonance imaging system, if necessary, the high-resolution image signal is derived from the MR signals by the reconstruction unit 31. The high-resolution image signal is applied to a signal input of the bandpass filter 45. One or more filtered high-resolution image signals (fIS) are derived from the high-resolution image signal on the basis of the mask image signals (mIS) applied to the bandpass filter. The bandpass filter 45 applies the mask image, delivered to the bandpass filter in the form of the mask image signal (mIS), as a bandpass filter to the high-resolution image applied to the signal input as a high-resolution image signal. The filtered high-resolution image signal (fIS) is applied to a monitor 50 so that the monitor displays the image information representing the filtered high-resolution image signal. The filtered high-resolution image signal is also stored in a buffer unit 51. The filtered high-resolution image signal stored in the buffer unit 51 can be further processed and/or applied to a printer so as to form a hard copy of the high-resolution image.

Figure 6:
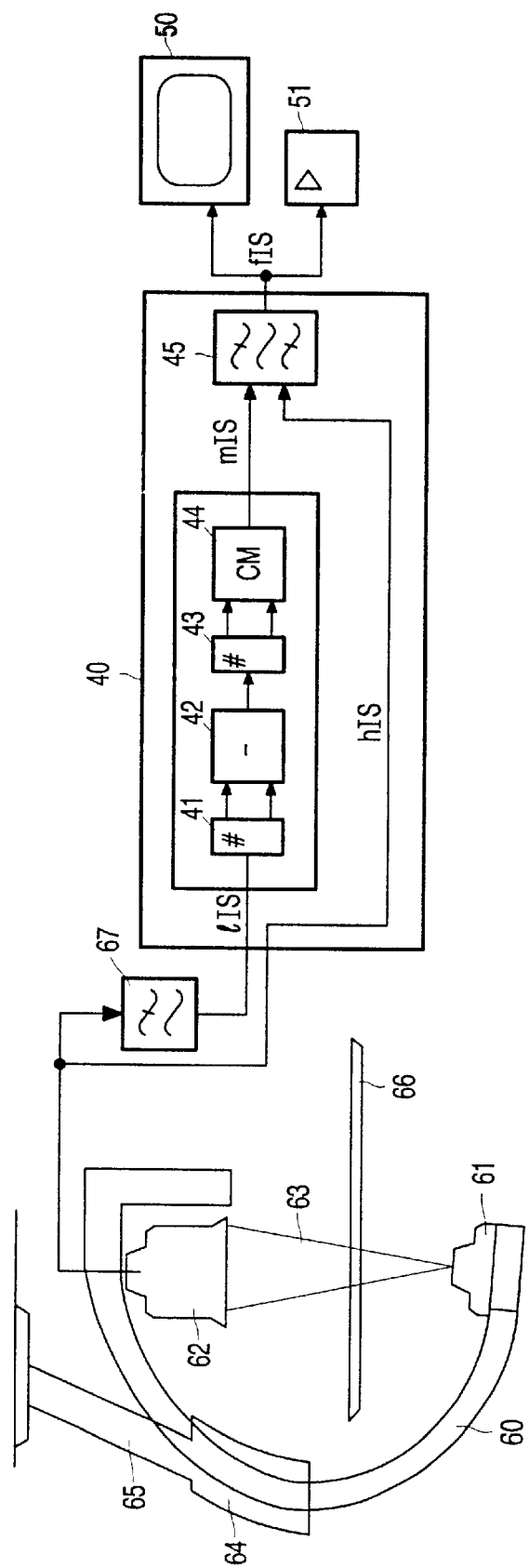
FIG. 6 shows diagrammatically an X-ray examination apparatus in which the invention is used.

FIG. 6 shows diagrammatically an X-ray examination apparatus in which the invention is used. The X-ray examination apparatus includes a C-arm 60 on which the X-ray source 61 and the X-ray detector 62 are mounted. The X-ray source emits an X-ray beam 63. The patient to be examined is positioned on a patient table 66 so that the X-ray beam 63 traverses a part of the body of the patient to be examined. An X-ray image is formed on the X-ray detector due to local differences in the X-ray absorption within the patient to be examined. The X-ray detector 62 derives electronic image signals from the successive X-ray images. The X-ray detector of the embodiment shown is formed by an X-ray image intensifier with a television camera. The X-ray image intensifier converts the X-ray image into an optical image which is picked up by the television camera. From the optical image the television camera derives the electronic image signal in the form of an electronic video signal from the optical image. It is alternatively possible to use an X-ray detector with a sensor matrix with a large number of sensor elements which are arranged in rows and columns. The incident X-rays generate electric charges in the sensor elements. These electric charges are detected, i.e. read out, and electronic image signals are derived from the electric charges by means of a read-out register.

The C-arm 60 is suspended from a support 65 by way of a sleeve 64. The C-arm is displaceable through the sleeve 64. The C-arm 60 with the sleeve 64 is rotatable relative to the support. Moreover, the support 65 is suspended from the ceiling of the radiology room in which the X-ray examination apparatus is installed. The support is rotatable about a vertical axis of rotation. The construction of the support with the sleeve and the C-arm enables the patient to be examined to be irradiated by means of the X-ray beam from various directions, so that X-ray images can be formed from different projection directions.

The X-ray detector supplies the image processing unit with the high-resolution image signal (hIS) in the form of an electronic image. The X-ray examination apparatus also includes a low-pass filter 67 for deriving the low-resolution image signals (lIS) from the successive electronic image signals of the X-ray detector. The low-resolution image signals (lIS) are also applied to the image processing unit 40. On the basis of the low-resolution image signals (lIS) the image processing unit derives the filtered high-resolution image signals (fIS) from the high-resolution image signal (hIS) in the same way as already described with reference to FIG. 5.

In the examples shown in the FIGS. 5 and 6 the mask image signals (mIS) from the cumulation unit 44 are applied as a bandpass filter to the high-resolution image signal (hIS) in order to form the filtered high-resolution image signal. However, according to the invention it is also possible to apply the difference images, representing the differences between the successive low-resolution images, as a bandpass filter to the high-resolution image. To this end it suffices to apply the difference image signals (dIS) to the control input of the bandpass filter 45.

All references cited herein, as well as the priority document European Patent Application 99201249.2 filed Apr. 20, 2000, are incorporated herein by reference in their entirety and for all purposes to the same extent as if each individual publication or patent or patent application was specifically and individually indicated to be incorporated by reference in its entirety for all purposes.

What is claimed is:

1. An image processing method comprising:
acquiring a succession of at least two low-resolution images,
deriving a series of at least one successive mask images from the low-resolution images,
acquiring a high-resolution image, and
applying at least one of the mask images to the high-resolution image as a filter in order to derive a filtered high-resolution image from the high-resolution image.

2. The image processing method as claimed in claim 1, wherein the step of applying further comprises applying a plurality of mask images to the high-resolution image as respective filters in order to derive successive filtered high-resolution images.

3. The image processing method as claimed in claim 1, wherein the step of applying further comprises assigning each pixel in the filtered high-resolution image the pixel value at the corresponding pixel of the high-resolution image, provided that the pixel value at the corresponding pixel in the relevant mask image is of a magnitude which exceeds a predetermined threshold value.

4. The image processing method as claimed in claim 3, wherein the step of deriving further comprises assigning pixels in the mask image a predetermined pixel value of a magnitude below the threshold value if the difference between the pixel values of the relevant pixels of the successive low-resolution images, which pixels correspond to the relevant pixel in the mask image, is smaller than a predetermined ceiling value.

5. The image processing method as claimed in claim 4, wherein the predetermined magnitude and the predetermined ceiling value are equal.

6. The method of claim 4 wherein the predetermined magnitude and the predetermined ceiling value are both zero.

7. The image processing method as claimed in claim 1, wherein the low-resolution images and the at least one high-resolution image are acquired by means of a magnetic resonance imaging method.

8. The image processing method as claimed in claim 1, wherein the low-resolution images and the high-resolution image are acquired by means of an X-ray examination method.

9. An imaging system comprising:
a magnetic resonance imaging system which is arranged
to acquire a succession of at least two low-resolution images and a high-resolution image, and
an image processing unit which is arranged
to derive a series of at least one successive mask images from the low-resolution images, and
to apply at least one of the mask images to the high-resolution image as a filter in order to derive a filtered high-resolution image from the high-resolution image.

10. An X-ray examination apparatus comprising:
an X-ray source for emitting an X-ray beam,
an X-ray detector for deriving a series of image signals from a series of X-ray images, and
a signal processing unit which is arranged to derive a succession of low-resolution image signals from the image signals of the X-ray detector,
to derive at least one high-resolution image signals from the image signals of the X-ray detector,
to derive at least one successive mask signals from the series of low-resolution image signals, and
to form at least one filtered high-resolution image signals by applying the mask signals as a filter to the at least one high-resolution image signals.

11. A workstation comprising a computer which is arranged to
receive a succession of at least two low-resolution images,
derive a series of at least one successive mask images from the low-resolution images,
receive a high-resolution image, and apply at least one of the mask images to the high-resolution image as a filter in order to derive a filtered high-resolution image from the high-resolution image.

12. A computer program comprising instructions for causing a computer to receive a succession of at least two low-resolution images, derive a series of at least one successive mask images from the low-resolution images, and apply at least one of the mask images to a high-resolution image as a filter in order to derive a filtered high-resolution image from the high-resolution image.

13. An image processing method comprising:

acquiring several successions of low-resolution images for separate projection orientations, acquiring at least one high-resolution image for separate projection orientations, deriving for the separate projection orientations a series of at least one successive mask images from the low-resolution images, and applying, for the separate projection orientations, at least one of the mask images to the high-resolution image as a filter in order to derive at least one filtered high-resolution images from the at least one high-resolution images.

* * * * *